Figure 1A:
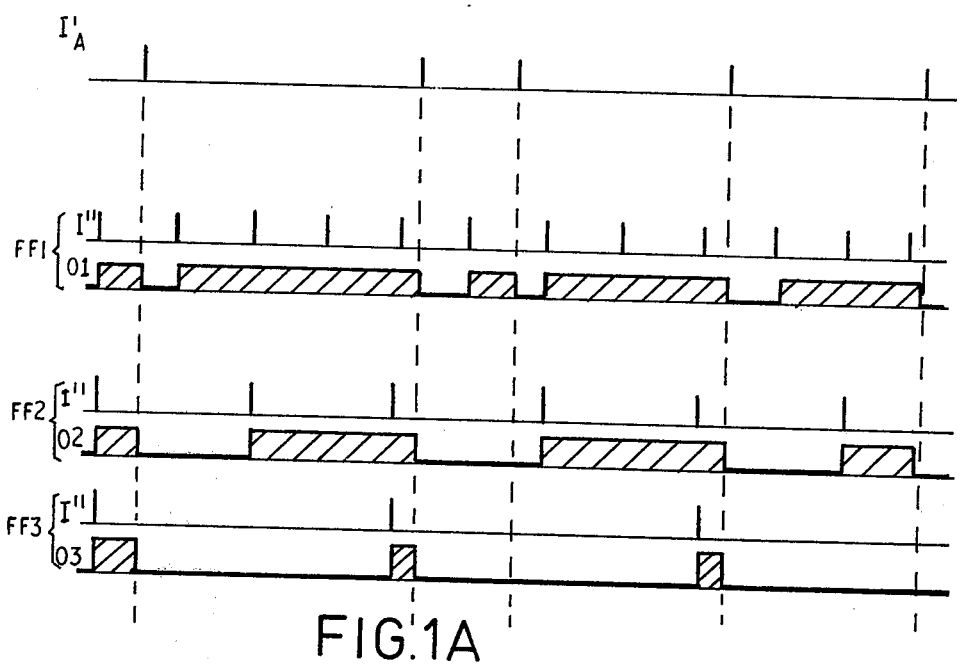

United States Patent [19]

Fraser

[11] 4,011,502
[45] Mar. 8, 1977

[54] LOGARITHMIC RATEMETER WITH BISTABLE SIGNAL COMPARISON

[75] Inventor: Herbert James Fraser, Bulli, Australia

[73] Assignee: Australian Atomic Energy Commission, Coogee, Australia

[22] Filed: Mar. 7, 1975

[21] Appl. No.: 556,541

[30] Foreign Application Priority Data

Mar. 27, 1974 Australia .................. 7047/74

[52] U.S. Cl. .................. 324/78 E; 324/78 J; 324/188; 328/45; 328/50
[51] Int. Cl.² .................. G01R 23/02
[58] Field of Search .......... 328/45, 50; 324/186, 324/188, 78 R, 78 J, 78 E

[56] References Cited
UNITED STATES PATENTS

| | | | |
|---|---|---|---|
| 3,050,713 | 8/1962 | Harmon | 324/188 |
| 3,564,284 | 2/1971 | Kamens | 324/188 |
| 3,704,414 | 11/1972 | Herbst | 324/78 J |

Primary Examiner—Gerard R. Strecker
Assistant Examiner—Michael J. Tokar
Attorney, Agent, or Firm—Haseltine, Lake & Waters

[57] ABSTRACT

A logarithmic ratemeter has a plurality of bistable devices each having two inputs the first of which is connected to a common input line for receiving voltage pulses from a detector of atomic particles and the second of which is connected to a secondary pulse train. The secondary pulse trains for the bistable devices are all different but maintain a constant frequency relationship to one another. Each bistable device produces an output signal the level of which indicates whether the device is in its first or second state and means are provided for summing the average values of the outputs of the bistable devices so as to provide an output signal which is a logarithm of the pulse rate received at the common input.

9 Claims, 7 Drawing Figures

LOGARITHMIC RATEMETER WITH BISTABLE SIGNAL COMPARISON

The present invention relates to apparatus for use as or in a ratemeter and more particularly is concerned with an arrangement for providing an output signal which is a function of the pulse rate of a pulsed input signal.

More particularly embodiments of the invention provide an output signal which is substantially the logarithm of an input signal. One important use of such an arrangement is in a detector for atomic radiation, in which a detector provides a voltage pulse for each atomic particle received.

Hitherto it has been common practice to provide radiation detectors in which the output is applied to a meter which is controlled by a range changing switch so that a reasonably accurate reading can be obtained over a wide range of values. The ranges are selected so that a given signal can be displayed by a reasonably large deflection across the scale of the display device.

However, such an arrangement has the disadvantage that in use the operator has to select the range appropriate and then to compute the actual radiation level from the scale reading multiplied by the appropriate factor applicable to the range selected. This arrangement gives scope for error of many orders of magnitude.

There is thus a need for a convenient and economic device which can provide an output display which covers a wide range of values, the scale of which being non-linear, for example logarithmic and which obviates or reduces the need for range changing.

According to the present invention, there is provided a novel apparatus which is characterized by plurality of bistable devices, each of which has two inputs, a first of which is to be connected to a common input signal which has a pulsed signal, the frequency of which may vary. Means are provided for applying a different pulsed train as the signal to the second of the inputs to each bistable device, each of these pulsed trains having a constant frequency relationship to one another. Each bistable device has an output for providing a signal which indicates which of the two states the device is in and the apparatus has a processing means for determining the proportion of time each of the devices is in a selected one of the stable states, and then to provide an output signal which has a summation of the proportion of time determined for each device.

A bistable device is one which has two stable states; a pulse arriving at a first of the inputs to the device, switches the device into the first stable state if the device is in the second state when the pulse arrives, but if the device is in the first state then the pulse arriving at the first input has no effect. Similarly a pulse at the second input will re-set the device to the second state if it is in the first state.

Therefore, if a random signal is applied to one input of the device and a constant frequency signal is applied to the other input, for example the second input, then the device will be switched from the second state to the first state on the arrival of a pulse from the random signal but will be switched back when the next pulse arrives at the second input. The more frequent the pulses in the random signal, the greater the proportion of time on average will the device reside in the first state.

It has been appreciated by the present inventor that if the same random signal is applied to each of two or more bistable devices having respective constant pulse trains applied to the second input thereof, then if, for example the second input of one bistable device receives pulses at a rate being 1/10th the rate of pulses applied to the other bistable device, then by summing the average output of each bistable device produces an output signal which is approximately proportional to the logarithm of the pulse rate of the input.

The novel arrangement proposed can be economic and simple to construct and a relatively accurate and easily operated instrument can be produced.

The invention also extends to a method of converting a digital signal to an analogue signal, the digital signal being the common pused input to the bistable devices.

One convenient and important embodiment of the invention resides in an electronic apparatus in which the bistable device is a bistable multivibrator (flip-flop).

Reference will now be made to FIGS. 1A, 1B, 2A and 2B of the accompanying drawings which schematically illustrate the basis upon which embodiments of the present invention operate.

Figure 1B:
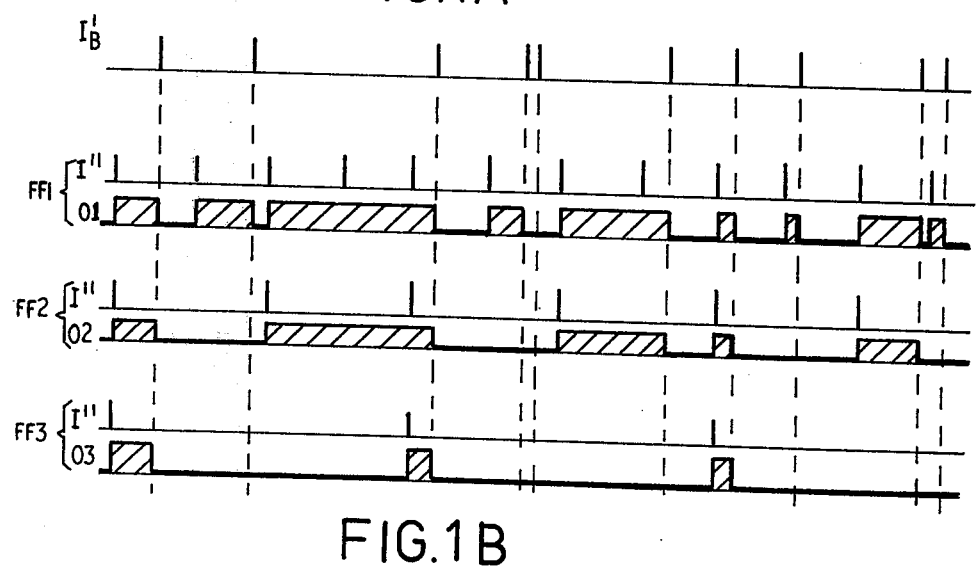

FIGS. 1A and 1B illustrate setting and resetting operations of the apparatus for respective random input pulse trains having different average pulse rates, the pulse rate of FIG. 1B being approximately twice the random pulse rate of FIG. 1A.

Figures 2A, 2B:
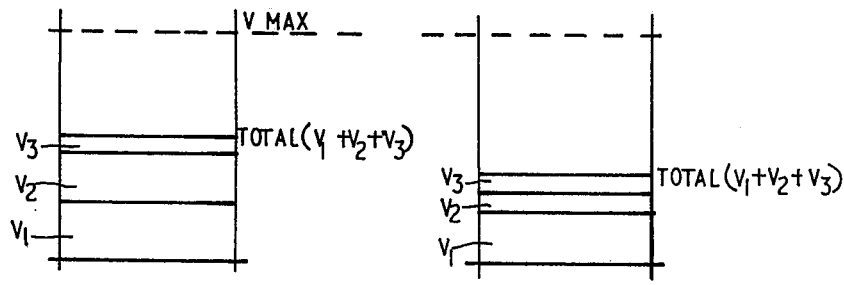

FIGS. 2A and 2B graphically illustrate the summation of the average outputs of the bistable devices respectively corresponding to FIGS. 1A and 1B.

In FIGS. 1A and 1B, the vertical direction represents pulse height (or voltage level) and the horizontal axis of each signal illustrated in each of FIGS. 1A and 1B represents time.

Referring to FIG. 1A, the top signal trace 1A represents a random pulse train of narrow pulses which is applied as a re-setting pulse to turn off each of three flip-flops, FF1, FF2, and FF3, the oscillator generated setting pulses I'' of each being illustrated together with the output of the flip-flop. The second flip-flop FF2 receives pulses from the oscillator at half the frequency of the pulses supplied to FF1 and similarly the third flip-flop FF3 has pulses spaced at four times the spacing of the pulses supplied to flip-flop FF1.

FIGS. 1A and 1B illustrate that the first flip-flop will be switched to a first state or "on" state when the first oscillator pulse arrives and the flip-flop then will be switched "off" when the first random resetting pulse arrives. This process continues with the flip-flop remaining in the condition in which it has been set if a second pulse from either the oscillator or the random source occurs without an intervening pulse from the other input.

It will be seen that flip-flop FF1 is switched "on" for most of the time, flip-flop FF2 is switched on for a large proportion of the time and flip-flop FF3 is switched on for a small proportion of the time.

FIG. 2A schematically illustrates the output of the apparatus when operating in accordance with FIG. 1A. The flip-flops FF1, FF2 and FF3 respectively have output signals of average value $V_1$, $V_2$ and $V_3$. The total output is a voltage made up of the components $V_1$, $V_2$ and $V_3$. It will be seen that $V_3$ is very small and $V_2$ is a little smaller than $V_1$. However, it will be appreciated that the relative contributions of $V_1$, $V_2$ and $V_3$ will vary in accordance with variations in the random pulse input. For example, if the random pulse input drops very substantially then clearly flip-flop FF3 will be switched off only infrequently and therefore it will be switched on for most of the time, as indeed will the other flip-flops. Thus, the total output will tend to approach a limit condition in which all the flip-flops are on for all the time and this level is indicated by the level Vmax in FIGS. 2A and 2B.

For the purpose of illustration, FIG. 1B illustrates the modification resulting from a higher average rate of random pulses, the rate being approximately twice that of FIG. 1A. For example, the pulses may come from a geiger counter or other detector.

In the notation adopted for this explanation, it can be said that each flip-flop of FIG. 1B tends to be turned off for more of the time than in FIG. 1A since there is a greater chance of a pulse from the random source occurring between successive pulses from the oscillator input to that flip-flop. Flip-flop FF1 is indeed switched off more often and thus the average value $V_1$ at its output is reduced a little. A similar change occurs in the value $V_2$ of the flip-flop FF2. However, since the random pulses occur at a rate substantially greater than the oscillator pulses applied to flip-flop FF3, in both FIGS. 1A and 1B there is little change in the value of $V_3$.

However, as shown in FIG. 2B, the total output, being the summation of the average of the outputs of the three flip-flops, is reduced. It should be noted that the reduction is not simply a division by 2 and indeed as will be explained hereinafter, with a random input source it is likely that the output signal of the apparatus approximates a logarithmic function of the rate of pulses from the random source.

A device having such a logarithmic output can be useful in many applications, e.g. in a radiation detector to cover a very wide range of possible count rates such as 1 per second to $10^8$ per second. A reasonably accurate reading could be provided simply by calibrating the scale of a voltmeter, and it would be unnecessary to provide range selection switches, which would need careful operation, and subsequent computation of the meter reading in order to arrive at the correct result.

In a preferred and important embodiment of the invention, a re-setting train of pulses is provided by an oscillator of relatively high frequency with suitable frequency dividers being provided to divide down the frequency to the desired rate for application to each of the bistable devices.

In one embodiment, the oscillator output is applied to the first flip-flop and the oscillator is also supplied to a frequency divided which divides the frequency by a factor such as ten for application to the second bistable device and in turn this signal is applied to another frequency divided to again step down the frequency by a factor of 10 for the next bistable device and so on.

For the purpose of assisting the provision of an accurate result, the apparatus preferably includes a pull-up resistor arrangement associated with the output of each bistable device, the arrangement being such that closely controlled voltage levels are present to characterise the output signals of the respective states of the bistable device.

For summing and averaging the outputs of the bistable devices, the signal from each device is applied through a summing resistor and the signal is applied to a common connection which is an input to an operational amplifier. Each summing resistor preferably has the same value.

Figure 4:
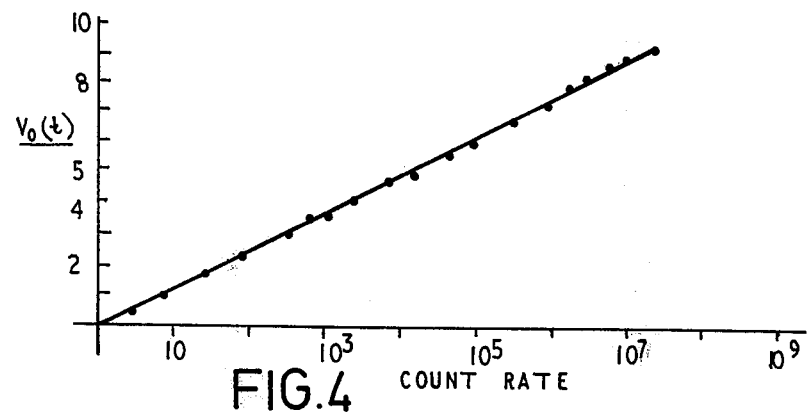
Figure 5:
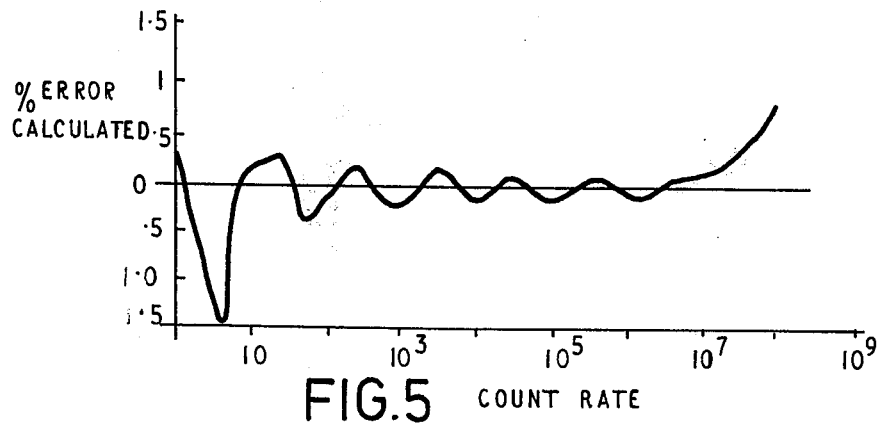
Figure 3:
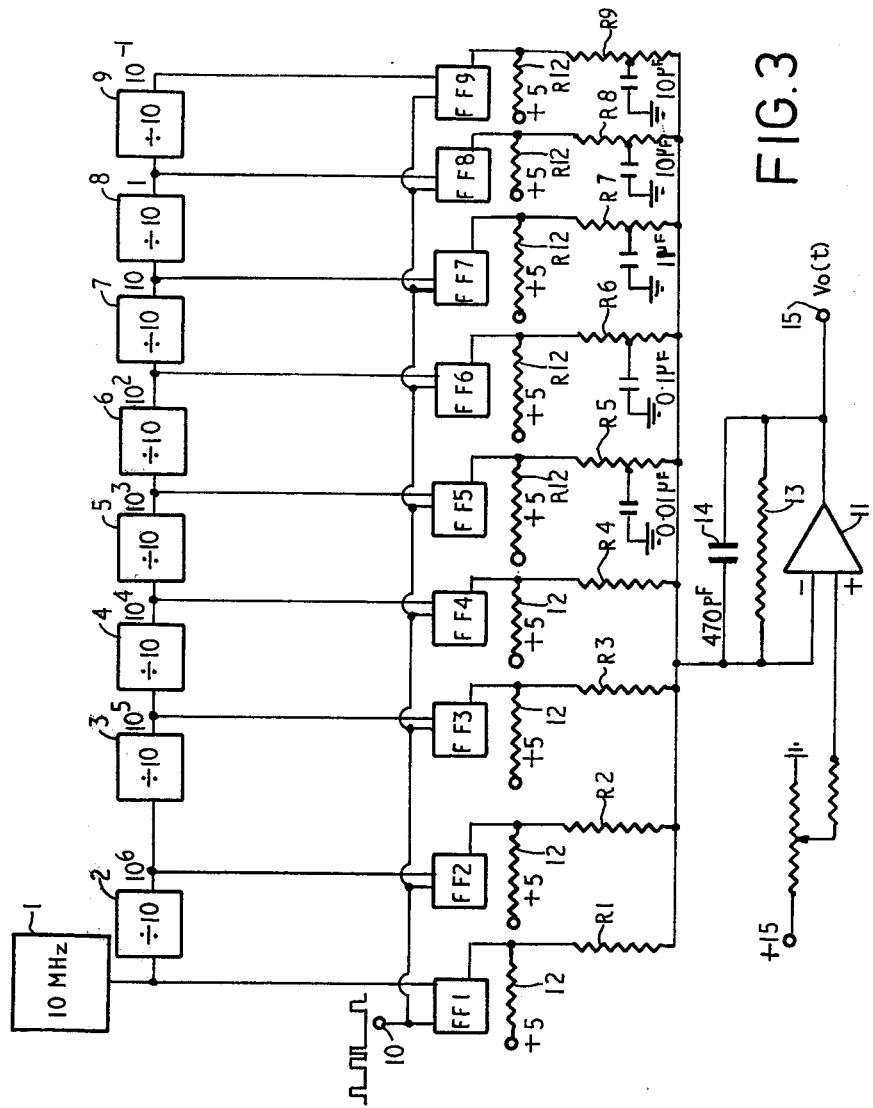

Reference will now be made to FIGS. 3 to 5 of the accompanying drawings wherein FIG. 3 is a circuit diagram of one embodiment of the invention and FIG. 4 is a diagram illustrating experimental results of the apparatus of FIG. 3; FIG. 5 is a graph of the calculated error of the apparatus showing the deviation from a true logarithmic relationship.

Referring first to FIG. 3, a 10 MHz oscillator 1 is connected to a flip-flop FF1, a second flip-flop FF2 receiving a pulse corresponding to every tenth pulse generated by the oscillator 1 by virtue of the operation of a frequency divider 2. The frequency divider operates to step down the frequency by a factor of 10. Similarly, all the other flip-flops FF3 to FF9 receive respective stepped down frequencies the stepping down being effected in each step by a factor of 10 by the frequency dividers 3 - 9.

A second input to each of the flip-flops FF1 to FF9 receives a signal from input 10, this input being connected to random pulse source, the pulses being of relatively narrow width. The device operates in accordance with the concepts illustrated in FIGS. 1 and 2, the output Q of each flip-flop being passed through a respective summing resistor R1 to R9 to an operational amplifier 11.

For the purpose of providing accuracy, each flip-flop output has a respective pull-up resistor 12 which is connected to a voltage supply, in this case a stabilised voltage supply of 5 volts. In this way the height of each pulse at the output of each flip-flop is accurately controlled. The operational amplifier 11 has a feed-back loop provided by a parallel arrangement of a resistor 13 and a small value capacitor 14. Respective capacitors are connected to the center of resistors R5 to R9, the value of these capacitors increasing by approximately a factor of ten to enable improvement of response time as the random rate increases. At output terminal 15 a voltage representing the summation of average output of the flip-flops occurs.

FIG. 4 shows the results of an experiment which proves that the signal at output 15 closely follows the logarithm of the input signal rate at input 10.

The graph of FIG. 5 is the result of calculations and shows that in the absence of instrument error the apparatus should provide a reading over the range in question within the limits + or− 1.5%.

It is thought that the apparatus generally or substantially as shown in FIG. 3 may be constructed so as to perform accurately without undue difficulties regarding component accuracy. Furthermore, it is thought that the device should have a very advantageous low level temperature drift and the device can provide a reading which is relatively accurate over a large number of decades. Furthermore, it is thought that the circuits can be constructed without the necessity for stringent matching or setting up of components as is required, for example, in a multiple diode pump circuit, for example as published by E. H. Cooke-Yarborough and E. W. Pulsord (Proc.I.E.E.98,196,1951).

In each of the flip-flops of the device, it can be shown that the average value of the flip-flop output Q is given by the equation $$Q = \frac{1 - e^{-x}}{x}$$

where the maximum value of Q equals 1 and $$x = \frac{f_r}{f_c}$$

These equations apply when the random input pulses re-set the flip-flops to zero output level.

X = the ratio of set to re-set pulse rates.

This equation has been the subject of experimental verification and close agreement has been found within the limits of experimental error.

Computer calculations have been effected to consider various cases wherein the frequency division between each flip-flop is in the range 2 – 10 and wherein the number of flip-flops varies from 6 – 15.

With the aid of computer calculation it has been shown that the invention can permit the provision of a measurement which closely approximates to a logarithmic law. The percentage error was calculated and for the apparatus of FIG. 3 the calculated error is illustrated in FIG. 5 and the error at no point exceeds 1.5%.

The circuit of FIG. 3 has been constructed using Schottky transistor-transistor logic but in some embodiments as preferred form of structure may involve the use of COSMOS logic, which does not require pull-up resistors, or any logic family which can operate at the maximum rate required.

I claim:

1. In a ratemeter apparatus having means for processing a pulsed random input signal to provide an output which is logarithmic indication of the pulse rate of the random input signal, the improvement comprising:
   i. the processing means having a plurality of bistable devices with respective first and second stable states;
   ii. first and second inputs to each bistable device, each said first input being adapted to receive said pulsed input signal;
   iii. means for supplying second pulsed signals to said second inputs of said bistable devices, each said second pulsed signal being different from but maintained in substantially constant frequency relation with each other second pulsed signal;
   iv. each said bistable device having automatic switching means responsive to a pulse received at said first or second input respectively, if and only if said bistable device is in said second or first stage respectively, to switch said bistable device from said second or first state to said first or second state respectively;
   v. each said bistable device having output means for providing a characteristic output signal indicative of the state in which the bistable device is residing;
   vi. and operating means
      a. for receiving said output signals,
      b. for determining the proportion of time during which each output signal characterizes a selected one of said states, and
      c. for providing an operating output corresponding to the summation of the proportions of time so determined for said plurality of bistable device.

2. An apparatus for providing an output signal which is a logarithmic function of a random input signal comprising
   i. a plurality of bistable devices each device having first and second inputs,
   ii. said first inputs being connected to a common input line for receiving said random input signal in the form of a pulse train,
   iii. each bistable device responding to a pulse at its first input as a setting pulse, the bistable device residing in a first state after responding to said setting pulse,
   iv. means for applying a respective and different train of pulses to the second input of each bistable device, said trains of pulses having a constant frequency relation, and each pulse of such a train acting as a re-setting pulse for the bistable device to which it is applied, the bistable device residing in a second state after responding to said re-setting pulse,
   v. each bistable device having output means for providing a signal, the level of which characterizes the first or second state of said bistable device, and
   vi. means for summing and averaging the signals of said output means to provide said output signal which is a function of the input signal.

3. Apparatus as claimed in claim 2, wherein the apparatus is an electronic apparatus, each said bistable device is a bistable multivibrator.

4. Apparatus as claimed in claim 3, wherein said levels are voltage levels and further comprising a pull-up resistor associated with the output means of each bistable device for controlling voltage levels characterising the states of each device.

5. Apparatus as claimed in claim 4, and including a summing resistor to which the output of each bistable device is applied, the resistors being connected to a common input to an operational amplifier.

6. Apparatus as claimed in claim 2 and further comprising an oscillator of high frequency and frequency divider means for supplying the trains of pulses to the second inputs of said bistable devices.

7. Apparatus as claimed in claim 6 wherein the oscillator supplies the second input signal directly to a first of the bistable devices, and to a first frequency divider which divides the frequency by a factor selected and fixed in the range 2 – 16, the output of the first frequency divider being passed to a second of the bistable devices and so on for any third or subsequent bistable devices.

8. In a ratemeter having an input connected to a detector for atomic particles which produces a voltage pulse for each atomic particle received, the improvement comprising apparatus as claimed in claim 2 having the common supply line connected to said detector and a display device for displaying said output signal, the output signal being substantially the logarithm of the rate of pulses produced by said detector.

9. A method of converting a digital signal to an analogue signal wherein the analogue signal is substantially a logarithm of the digital signal, the method comprising using apparatus as claimed in claim 2, the common supply line receiving said digital signal, and said output signal being said analogue signal.

* * * * *